(12) United States Patent
Dozier, II et al.

(10) Patent No.: US 7,059,047 B2
(45) Date of Patent: Jun. 13, 2006

(54) SOCKETS FOR "SPRINGED" SEMICONDUCTOR DEVICES

(75) Inventors: Thomas H. Dozier, II, Livermore, CA (US); Benjamin N. Eldridge, Danville, CA (US); Gary W. Grube, Pleasanton, CA (US); Igor Y. Khandros, Orinda, CA (US); Gaetan L. Mathieu, Livermore, CA (US); David V. Pedersen, Scotts Valley, CA (US); Michael A. Stadt, Castro Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/673,691

(22) Filed: Sep. 29, 2003

(65) Prior Publication Data

US 2004/0064941 A1    Apr. 8, 2004

Related U.S. Application Data

(60) Division of application No. 10/299,131, filed on Nov. 19, 2002, now Pat. No. 6,642,625, which is a continuation of application No. 09/819,143, filed on Mar. 27, 2001, now Pat. No. 6,534,856, which is a continuation of application No. 09/519,279, filed on Mar. 7, 2000, now Pat. No. 6,232,149, which is a continuation of application No. 09/108,163, filed on Jun. 30, 1998, now Pat. No. 6,033,935.

(60) Provisional application No. 60/051,365, filed on Jun. 30, 1997.

(51) Int. Cl.
    *H01R 9/00*    (2006.01)

(52) U.S. Cl. .............. 29/845; 29/832; 29/831; 29/837; 29/838; 29/842; 29/739; 29/741; 439/81; 439/816; 438/117; 438/455; 438/464; 438/667; 361/769

(58) Field of Classification Search .............. 29/837, 29/838, 830, 831, 832, 842, 844–845, 846, 29/852, 857, 861, 739, 740, 741; 439/81, 439/816; 438/117, 455, 464, 667; 361/769
See application file for complete search history.

(56) References Cited

U.S. PATENT DOCUMENTS

| | | | |
|---|---|---|---|
| 2,740,097 A | * | 3/1956 | Edelman et al. .............. 439/75 |
| 3,290,636 A | | 12/1966 | Overtveld |
| 3,379,937 A | | 4/1968 | Shepherd |
| 3,676,832 A | | 7/1972 | Judge et al. |
| 3,982,159 A | | 9/1976 | Dennis et al. |
| 4,074,342 A | | 2/1978 | Honn et al. |

(Continued)

FOREIGN PATENT DOCUMENTS

EP           0 422 584       4/1991

(Continued)

*Primary Examiner*—Richard Chang
(74) *Attorney, Agent, or Firm*—N. Kenneth Burraston (57) ABSTRACT

Temporary connections to spring contact elements extending from an electronic component such as a semiconductor device are made by urging the electronic component, consequently the ends of the spring contact elements, vertically against terminals of an interconnection substrate, or by horizontally urging terminals of an interconnection substrate against end portions of the spring contact elements. A variety of terminal configurations are disclosed.

38 Claims, 5 Drawing Sheets

U.S. PATENT DOCUMENTS

| | | |
|---|---|---|
| 4,417,777 A | 11/1983 | Bamford |
| 4,480,888 A | 11/1984 | Hopkins et al. |
| 4,533,199 A * | 8/1985 | Feldberg .................. 439/404 |
| 4,616,414 A * | 10/1986 | Cushman .................... 29/835 |
| 4,627,161 A * | 12/1986 | Cushman .................... 29/838 |
| 4,667,219 A | 5/1987 | Lee et al. |
| 4,761,140 A | 8/1988 | Geib |
| 4,833,776 A * | 5/1989 | Wakamiya et al. .......... 29/837 |
| 4,893,172 A | 1/1990 | Matsumoto et al. |
| 4,906,194 A | 3/1990 | Grabbe |
| 4,950,980 A | 8/1990 | Pfaff |
| 5,015,946 A * | 5/1991 | Janko ....................... 324/754 |
| 5,038,467 A * | 8/1991 | Murphy ...................... 29/845 |
| 5,045,975 A | 9/1991 | Cray et al. |
| 5,067,007 A | 11/1991 | Otsuka et al. |
| 5,106,309 A | 4/1992 | Matsuoka et al. |
| 5,123,850 A | 6/1992 | Elder et al. |
| 5,124,646 A | 6/1992 | Shiraishi |
| 5,131,535 A | 7/1992 | O'Conner et al. |
| 5,160,270 A | 11/1992 | Reymond |
| 5,189,507 A | 2/1993 | Carlomagno et al. |
| 5,230,632 A | 7/1993 | Baumberger et al. |
| 5,302,891 A | 4/1994 | Wood et al. |
| 5,366,380 A | 11/1994 | Reymond |
| 5,371,654 A | 12/1994 | Beaman et al. |
| 5,425,649 A * | 6/1995 | Reymond .................... 439/189 |
| 5,437,556 A | 8/1995 | Bargain et al. |
| 5,455,390 A | 10/1995 | DiStefano et al. |
| 5,500,605 A | 3/1996 | Chang |
| 5,541,525 A | 7/1996 | Wood et al. |
| 5,561,594 A | 10/1996 | Wakefield |
| 5,573,435 A | 11/1996 | Grabbe et al. |
| 5,574,384 A | 11/1996 | Oi |
| 5,635,832 A | 6/1997 | Ito et al. |
| 5,669,774 A | 9/1997 | Grabbe |
| 5,686,842 A | 11/1997 | Lee |
| 5,714,803 A | 2/1998 | Queyssac |
| 5,772,451 A | 6/1998 | Dozier, II et al. |
| 5,807,104 A | 9/1998 | Ikeya et al. |
| 5,819,410 A * | 10/1998 | Furusawa et al. ............. 29/883 |
| 5,897,326 A | 4/1999 | Eldridge et al. |
| 5,917,707 A | 6/1999 | Khandros et al. |
| 5,932,891 A | 8/1999 | Higashi et al. |
| 5,994,152 A | 11/1999 | Khandros et al. |
| 5,998,864 A | 12/1999 | Khandros et al. |
| 6,029,344 A | 2/2000 | Khandros et al. |
| 6,033,935 A | 3/2000 | Dozier, II et al. |
| 6,043,666 A | 3/2000 | Kazama |
| 6,046,597 A | 4/2000 | Barabi |
| 6,051,982 A | 4/2000 | Alcoe et al. |
| 6,064,213 A | 5/2000 | Khandros et al. |
| 6,078,500 A | 6/2000 | Beaman et al. |
| 6,174,174 B1 * | 1/2001 | Suzuki et al. ................. 439/71 |
| 6,232,149 B1 | 5/2001 | Dozier, II et al. |
| 6,449,838 B1 * | 9/2002 | Murakami ................... 29/840 |
| 6,534,856 B1 | 3/2003 | Dozier, II et al. |
| 6,642,625 B1 | 11/2003 | Dozier, II et al. |
| 2001/0002624 A1 | 6/2001 | Khandros et al. |

FOREIGN PATENT DOCUMENTS

| | | |
|---|---|---|
| JP | 61170054 | 7/1986 |
| JP | 3142847 | 6/1991 |
| WO | WO 92 20203 | 11/1992 |
| WO | WO 94 23475 | 10/1994 |
| WO | WO 96 17378 | 6/1996 |
| WO | WO 98/01906 | 1/1998 |

* cited by examiner

Figure 9B

SOCKETS FOR "SPRINGED" SEMICONDUCTOR DEVICES

CROSS-REFERENCE TO RELATED APPLICATIONS

This is a division of U.S. application Ser. No. 10/299,131, filed Nov. 19, 2002 now U.S. Pat. No. 6,642,625, which is a continuation of U.S. application Ser. No. 09/819,143, filed Mar. 27, 2001 (now U.S. Pat. No. 6,534,856), which is a continuation of U.S. application Ser. No. 09/519,279, filed Mar. 7, 2000 (now U.S. Pat. No. 6,232,149), which is a continuation of U.S. application Ser. No. 09/108,163, filed Jun. 30, 1998 (now U.S. Pat. No. 6,033,935), which claims the benefit of U.S. Provisional Patent Application No. 60/051,365, filed Jun. 30, 1997.

TECHNICAL FIELD OF THE INVENTION

The invention relates to making interconnections between electronic components, especially microelectronic components and, more particularly, to interconnection elements (contact structures) exhibiting resiliency (springiness), and methods of making same.

BACKGROUND OF THE INVENTION

Commonly-owned U.S. patent application Ser. No. 08/152,812 filed Nov. 16, 1993 (now U.S. Pat. No. 4,576,211, issued Dec. 19, 1995), and its counterpart commonly-owned copending "divisional" U.S. patent applications Ser. No. 08/457,479 filed Jun. 1, 1995 (status: pending) and Ser. No. 08/570,230 filed Dec. 11, 1995 (status: pending), all by KHANDROS, disclose methods for making resilient interconnection elements for microelectronics applications involving mounting an end of a flexible elongate core element (e.g., wire "stem" or "skeleton") to a terminal on an electronic component, coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, copending U.S. patent application Ser. No. 08/340,144 filed Nov. 15, 1994 and its corresponding PCT Patent Application No. PCT/US94/13373 filed Nov. 16, 1994 (WO95/14314, published May 26, 1995), both by KHANDROS and MATHIEU, disclose a number of applications for the aforementioned spring contact elements, and also discloses techniques for fabricating contact pads (contact tip structures) at the ends of the spring contact elements.

Commonly-owned, copending U.S. patent application Ser. No. 08/452,255 filed May 26, 1995 and its corresponding PCT Patent Application No. PCT/US95/14909 filed Nov. 13, 1995 (WO96/17278, published Jun. 6, 1996), both by ELDRIDGE, GRUBE, KHANDROS and MATHIEU, disclose additional techniques and metallurgies for fabricating spring contact elements as composite interconnection structures and for fabricating and mounting contact tip structures to the free ends (tips) of the composite interconnection elements.

Commonly-owned, copending U.S. patent application Ser. No. 08/558,332 filed Nov. 15, 1995 by ELDRIDGE, GRUBE, KHANDROS and MATHIEU, and its corresponding PCT Patent Application No. US95/14885 filed Nov. 15, 1995 by ELDRIDGE, GRUBE, KHANDROS and MATHIEU disclose methods of fabricating resilient contact structures which are particularly well-suited to fabricating spring contact elements directly on semiconductor devices. As used herein, a semiconductor device having spring contact elements mounted thereto is termed a "springed semiconductor device".

Commonly-owned, copending U.S. Provisional Patent Application No. 60/024,555 filed Aug. 26, 1996, by ELDRIDGE, KHANDROS and MATHIEU, and PCT Patent Application No. US97/08606 filed May 15, 1997 by DOZIER, ELDRIDGE, KHANDROS, MATHIEU and TAYLOR disclose additional contact tip structure metallurgies and structures.

The present invention addresses and is particularly well-suited to making interconnections to modern microelectronic devices having their terminals (bond pads) disposed at a fine-pitch. As used herein, the term "fine-pitch" refers to microelectronic devices that have their terminals disposed at a spacing of less than 5 mils, such as 2.5 mils or 65 μm. As will be evident from the description that follows, this is preferably achieved by taking advantage of the close tolerances that readily can be realized by using lithographic rather than mechanical techniques to fabricate the contact elements.

BRIEF DESCRIPTION (SUMMARY) OF THE INVENTION

As mentioned above, a semiconductor device having spring contact elements mounted thereto is termed a "springed semiconductor device". Such a device may be interconnected to an interconnection substrate in one of two main ways. It may be "permanently" connected such as by soldering the free ends of the spring contact elements to corresponding terminals on an interconnection substrate such as a printed circuit board. Alternatively, it may be "temporarily" connected to the terminals simply by urging the springed semiconductor device against the interconnection substrate so that a pressure connection is made between the free ends of the spring contact elements and the terminals. Another way of looking at such temporary pressure connections is that the springed semiconductor device is "self-socketing".

The ability to remove a springed semiconductor device from its temporary pressure connection with an interconnection substrate is certainly useful in the context of replacing or upgrading the springed semiconductor device. In this context, it is important that the pressure connections be robust, and capable of withstanding the wear and tear associated with normal operations. Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring contact element demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

A more fundamental object is achieved simply by making transient (very temporary) connections to a springed semiconductor device. And that is, the ability to test the springed semiconductor device prior to temporarily or permanently mounting it to an interconnection substrate of a system to (1), if necessary, burn-in the springed semiconductor device and (2) to ascertain whether the springed semiconductor device is measuring up to its specifications. As a general proposition, this can be accomplished by making "transient" pressure connections with the spring contact elements with relaxed constraints on contact force and the like. The making of such transient connections to springed semiconductor devices is the focus of the present invention. The present invention discloses a number of techniques for socketing (making transient pressure connections) to springed semiconductor devices.

According to the invention, methods and apparatuses for effecting a temporary connection to a portion of an elongate spring contact element mounted to and extending from an electronic component are provided.

In one embodiment, an interconnection substrate has a terminal which is a plated through hole. The spring contact element is inserted through the through hole so that a portion of the spring contact element is within the through hole.

Additional methods, apparatuses and embodiments thereof are disclosed herein.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

In the following figures, a springed semiconductor device is shown with spring contact elements which are mounted thereto and extend therefrom contacting corresponding terminals of an interconnection substrate. In some of the figures, the spring contact elements are shown contacting the terminals. Other of the figures are slightly exploded for illustrative clarity, showing the spring contact elements nearly in contact with the terminals.

DETAILED DESCRIPTION OF THE INVENTION

Figure 1:
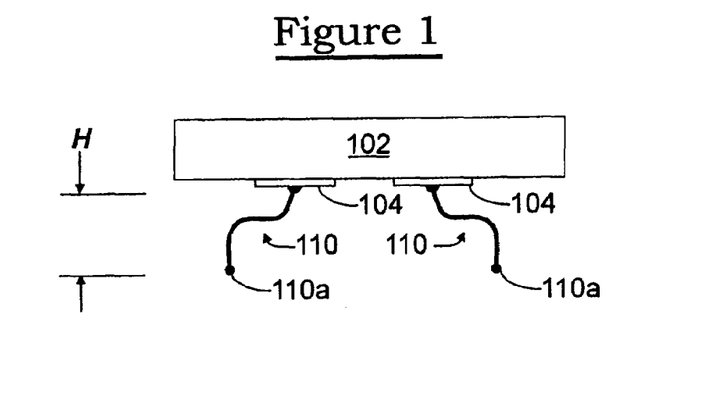
FIG. 1 is a side cross-sectional view of a "springed" semiconductor device, according to the invention.

FIG. 1 illustrates a "springed" semiconductor device 102, which is an electronic component having a plurality (two of many shown) of free-standing elongate microspring spring contact structures 110 mounted to and extending from a corresponding plurality (two of many shown) of terminals 104 on a surface thereof. Each spring contact element 110 extends laterally parallel to the surface of the component 102 (in the "x" and "y" axes, and extends to a height "H" in the z-axis above the surface of the component 102.

As discussed in a number of the aforementioned patents and patent applications, the springed semiconductor device 102 can be connected to another electronic component such as a printed circuit board (PCB) or other suitable interconnection substrate simply by urging the free ends (tips) 110a of the spring contact elements 110 against corresponding terminals (not shown) on the PCB (not shown). Alteratively, the free ends (tips) of the spring contact elements 110 can be soldered to the terminals of the PCB or interconnection substrate.

Figure 2:
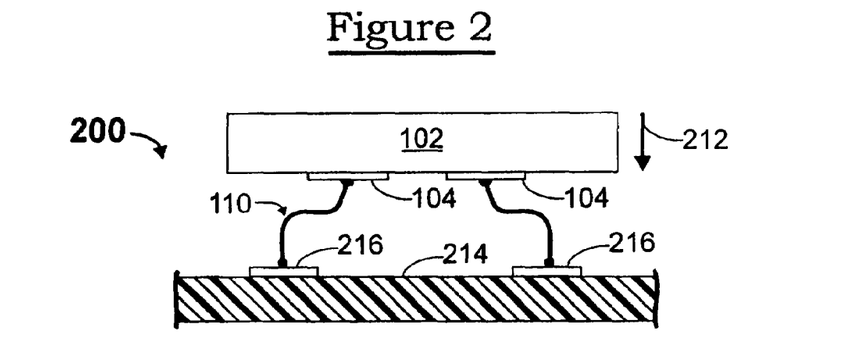
FIG. 2 is a side cross-sectional view of a "springed" semiconductor device being urged against an interconnection substrate such as a printed circuit board (PCB), according to the invention.

FIG. 2 illustrates a technique 200 wherein the "springed" semiconductor device 102 is urged (in the direction of the arrow 212) against an interconnection substrate such as a printed circuit board (PCB) 214 so that the tips 110a come into pressure contact with a corresponding plurality (two of many shown) of terminals 216 on the PCB 214 to establish a pressure connection therewith. As mentioned above, the tips 110a of the spring contact elements 110 can also be soldered to the terminals 216 of the PCB 214. The present invention, however, is principally directed to making temporary connections with the spring contact elements (110) of springed semiconductor devices (102).

FIG. 2, and the figures that follow, are illustrative of making temporary pressure connections to a springed semiconductor device such as for testing the semiconductor device. In this context, the semiconductor device is termed a "device under test" (DUT). In some of the figures, such as in FIG. 2, the temporary pressure connection is made in the z-axis, by applying "vertical" pressure to the tip (110a) of the spring contact element (110) in a direction which is perpendicular to the surface of the electronic component 102. In other of the figures, such as in FIG. 6A, the temporary pressure connection is made in the x or y axes, by applying "horizontal" pressure to a midportion of the spring contact element (110) in a direction which is parallel to the surface of the electronic component 102.

Figure 2A:
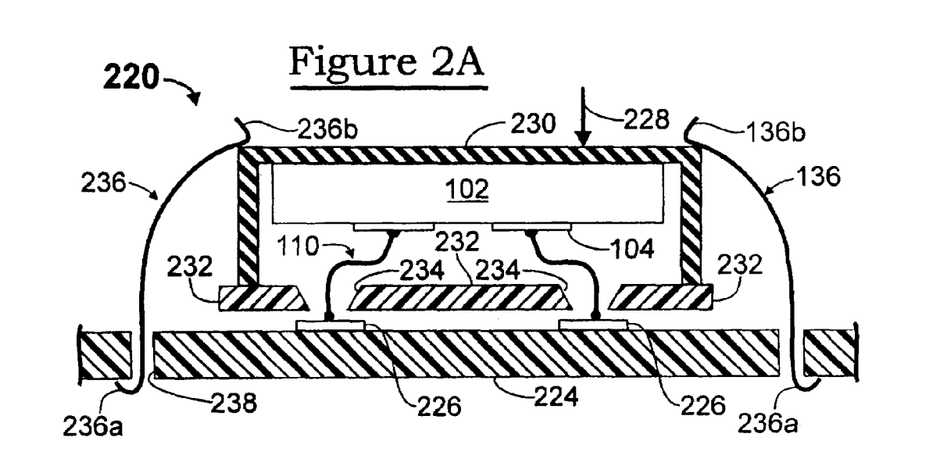
FIG. 2A is a side cross-sectional view of another technique of urging a springed semiconductor device against an interconnection substrate, according to the invention.

FIG. 2A illustrates another technique 220 for making a vertical temporary pressure connection with spring contact elements 110 of a springed semiconductor device (DUT) 102. In a manner similar to that of the technique illustrated in FIG. 2, the tips 110a of the spring contact elements 110 make pressure connections (contact) with terminals 226 (compare 216) of a PCB 224 (compare 214), as illustrated by the arrow 228 (compare 212). In this example, the DUT 102 is housed within a metal cap (housing) 230 which is a five-sided box such that the back side (top, as viewed) of the DUT is against the bottom surface of the housing 230. The open (bottom, as viewed) end of the housing 230 is covered by a rigid planar member (substrate) 232 which has a plurality (two of many shown) of guide holes 234 aligned with the tips 110a of the spring contact elements 110 which extend therethrough. For example, for spring contact elements 110 having a height "H" of 50 mils, the spring contact elements 110 extend 5 mils beyond the external (bottom, as viewed) surface of the rigid planar substrate 232.

The rigid planar substrate 232 is suitably formed of silicon and the guide holes are suitably tapered with their wide ends facing the DUT 102 and the interior of the housing 230, and is suitably formed of a silicon wafer using conventional semiconductor micromachining techniques. As illustrated, the rigid planar substrate 232 is sized to extend slightly, such as 100–250 mils beyond the four (two visible in the figure) sidewalls of the housing 230, to completely cover the open (bottom, as viewed) end of the housing 230. In this manner, the DUT 102 and a major portion of each spring contact element 110 are protected from inadvertent mechanical damage, such as from handling this springed semiconductor device "subassembly" (102, 110, 232).

As illustrated in FIG. 2A, the subassembly of the DUT 102 within the housing 230 is held against the front (top, as viewed) surface of the PCB 224 by suitable mechanical means, such as spring clips 236 having two ends, one end 236a extending into or through corresponding holes 238 in the PCB 224, the other end 236b extending over the external bottom (top, as viewed) surface of the housing 230. In this manner, a reliable desired amount of pressure can be effected between the spring contact elements 110 and corresponding terminals 226 of the PCB 224. Such an arrangement is suitable for testing (transient connection) or for more permanent demountable mounting of the subassembly (102/230) to the PCB.

In summary, there has been described in FIGS. 2 and 2A a method of effecting temporary connections to free ends (tips) of elongate spring contact elements mounted to and extending from an electronic component such as a semiconductor device by:

urging the springed semiconductor device (DUT) against an interconnection substrate (e.g., PCB) so that the tips of the spring contact elements vertically contact corresponding terminals on the PCB.

Another Vertical Technique

Commonly-owned, copending PCT Patent Application No. US95/14842 filed Nov. 13, 1995 by Dozier, Eldridge, Grube, Khandros and Mathieu [C-5-PCT] discloses methods of removably mounting electronic components to a circuit board (interconnection substrate) by providing a socket element with solder contacts on one side thereof and with elongate free-standing spring contact elements on another side thereof, particularly for making pressure connections to corresponding balls and lands of ball grid array (BGA) and land grid array (LGA) electronic components.

Figure 3:
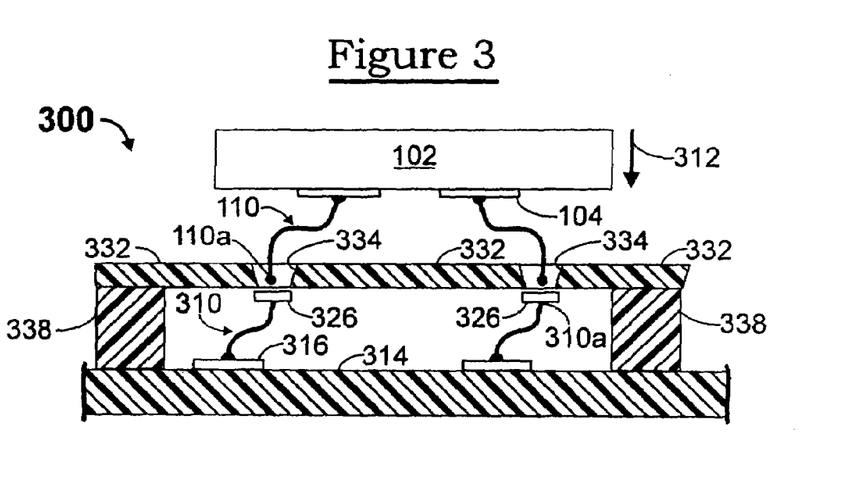
FIG. 3 is a side cross-sectional view of another technique of urging a springed semiconductor device into contact with terminals of an interconnection substrate, according to the invention.

FIG. 3 illustrates another technique 300 of making vertical pressure connections to tips of spring contact elements 110 of a springed semiconductor device (DUT) 102. Whereas in the techniques described with respect to FIGS. 2 and 2A the interconnection substrate (214, 224) simply had terminals against which the tips (110a) of the spring contact elements (110) were pressed, in this technique, the tips 110a of the spring contact elements 110 are pressed against terminals 326 (compare 216) which are disposed at and joined to the free ends 310a of free standing resilient contact structures 310 (compare 110) which are mounted to and extend from corresponding terminals 316 (compare 216) of an interconnection substrate 314 (compare 214). In this manner, the terminals 326 are yielding in the z-axis. The DUT 102 is moved in the direction indicated by the arrow 312 (compare 212) to effect the connection(s).

The terminals 326 of the resilient contact structures 310 are formed in any suitable manner, such as has been described with respect to joining prefabricated contact tip structures to free ends of elongate resilient contact structures described, for example, in commonly-owned PCT Patent Application Nos. US96/08107 filed May 24, 1996 by Eldridge, Khandros and Mathieu [C-14-PCT] and US97/08606 filed May 15, 1997 by Dozier, Eldridge, Khandros, Mathieu and Taylor [C-17-PCT], and may be provided with any suitable metallurgy and topology (surface flatness and texture) to optimize pressure connections being made between the terminals 326 and the ends 110 of the spring contact elements 110. The terminals 326 are suitably "pads" having a cross-dimension (e.g., diameter) of 8–10 mils and are joined to the ends of the elongate resilient contact structures 310 which have a smaller cross-dimension (diameter) such as 4–6 mils.

In a manner similar and comparable to that of the housing 230 (see FIG. 2A) a rigid planar substrate 332 (compare 232) is disposed parallel to the surface of the interconnection substrate 314 at a distance from its surface which is sufficient to be just above the terminals 326, and is provided with holes 334 (compare 234) therethrough which are aligned with the terminals 326. The substrate 332 is maintained in this position by suitable spacers 338 which may be a single, rigid, square, rigid ring-like structure which is comparable to the socket body (332) of the aforementioned US95/14842 [C-5-PCT]. In a manner similar to that described hereinabove with respect to FIG. 2A, the rigid structure 332 is suitably formed of a silicon wafer using conventional semiconductor micromachining techniques so that the holes 334 are tapered, with their wider opening on the exterior (top, as viewed) surface of the rigid substrate 332.

Suitably dimensioned, the "socket" formed by the interconnection substrate 314, the resilient contact structures 310 having pads 326 mounted at their ends, and the rigid substrate 332 having holes 334 aligned with the pads 326 can serve as a socket for a ball grid array (BGA) package (not shown) rather than as a socket for a springed semiconductor device 102.

In this manner, there is provided a test socket for making temporary pressure connections to tips of elongate contact structures extending from a DUT by:

providing a plurality of elongate free-standing resilient contact structures from corresponding terminals on an interconnection substrate, each of said resilient contact structures being provided with "floating" terminals at their free ends for receiving tips of the elongate contact structures extending from the DUT.

Another Technique

Figure 4:
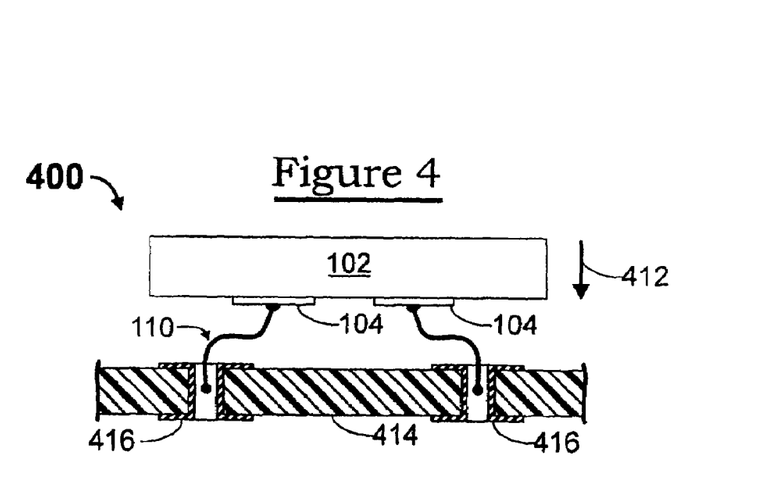
FIG. 4 is a side cross-sectional view of another technique of connecting a springed semiconductor device to terminals of an interconnection substrate, according to the invention.

FIG. 4 illustrates another technique 400 of effecting pressure connections to elongate spring contact elements 110 mounted to and extending from a semiconductor device 102. This technique is neither strictly vertical (as is the case with the techniques described hereinabove) or horizontal (as is the case with the techniques described hereinbelow).

In this technique, end portions (commencing at the ends 110a and extending along the spring contact elements 110) of the spring contact elements 110 are inserted into plated through hole terminals 416 (compare 216) of an interconnection substrate 414 (compare 214) such as a printed circuit board. With a suitable, such as "wavy" shape to the end portions of the spring contact elements 110, a pressure connection may be effected between the spring contact elements 110 and the terminals 416. The semiconductor device 102 is moved in a direction indicated by the arrow 412 (compare 212) to effect the connection(s).

This technique of "plugging" the end portions of the spring contact elements 110 into plated through holes is very amenable to subsequently soldering the springed semiconductor device 102 in place on the PCB 414. The springed semiconductor device 102 could subsequently be removed (e.g., for replacement) simply by heating to melt the solder, cleaning the through holes, and reinserting and soldering into place another springed semiconductor device.

In this manner, there is provided a socketing technique making connections with end portions of elongate contact structures extending from a semiconductor device by:

providing a plurality of terminals which are plated through holes in an interconnection substrate; and plugging the end portions of the elongate contact structures into the through holes; and optionally, soldering the elongate contact structures to the terminals.

Another Vertical Technique

Figure 5A:
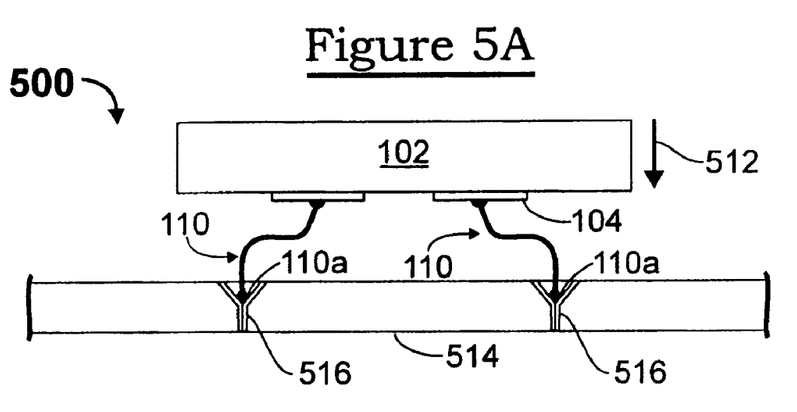
FIG. 5A is a side cross-sectional view of a technique of urging a springed semiconductor device into contact with concave terminals of an interconnection substrate, according to the invention.
Figure 5B:
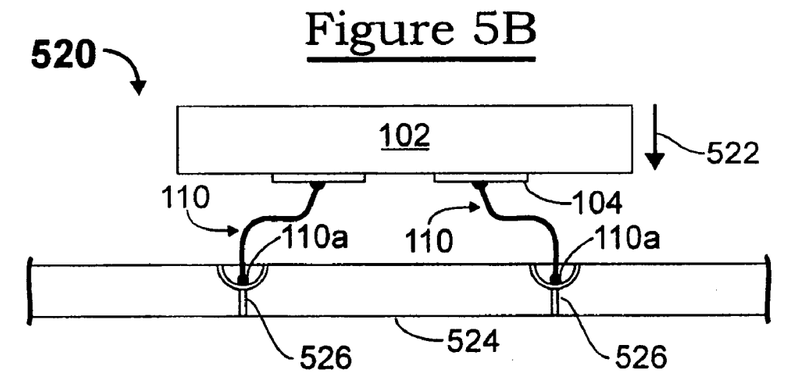
FIG. 5B is a side cross-sectional view of another technique of urging a springed semiconductor device into contact with concave terminals of an interconnection substrate, according to the invention.
Figure 5C:
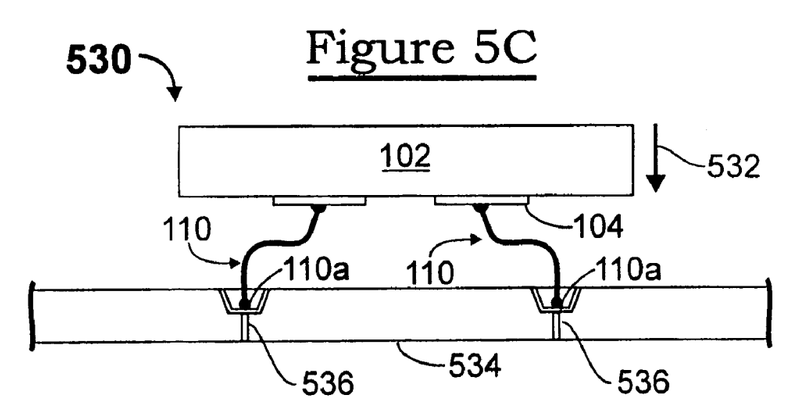
FIG. 5C is a side cross-sectional view of another technique of urging a springed semiconductor device into contact with concave terminals of an interconnection substrate, according to the invention.

FIGS. 5A, 5B and 5C illustrates other techniques 500, 520 and 530, respectively, of effecting pressure connections to elongate spring contact elements 110 mounted to and extending from a semiconductor device 102. This technique effects a vertical pressure connection between concave terminals of an interconnection substrate and the tips 110a of the spring contact elements 110 extending from the DUT 102.

As shown in FIG. 5A, the ends 110a of the spring contact elements 110) of the spring contact elements 110 are brought vertically, as indicated by the arrow 512 (compare 212), into contact with corresponding ones of a plurality (two of many shown) of terminals 516 (compare 216) of an interconnection substrate 514 (compare 214). The terminals 516 are concave. In this example, the terminals 516 are formed like plated through holes (compare 416) that have an upper portion in the form of a cone or pyramid which has its base at an upper (top, as viewed) surface of the interconnection substrate 514 and its apex (point) within the interconnection substrate 514.

As shown in FIG. 5B, the ends 110a of the spring contact elements 110) of the spring contact elements 110 are brought vertically, as indicated by the arrow 522 (compare 212), into contact with corresponding ones of a plurality (two of many shown) of terminals 526 (compare 216) of an interconnection substrate 524 (compare 214). The terminals 526 are concave. In this example, the terminals 526 are formed like plated through holes (compare 416) that have an upper portion in the form of a hemisphere which has its base at an upper (top, as viewed) surface of the interconnection substrate 524 and its apex within the interconnection substrate 524.

As shown in FIG. 5C, the ends 110a of the spring contact elements 110) of the spring contact elements 110 are brought vertically, as indicated by the arrow 532 (compare 212), into contact with corresponding ones of a plurality (two of many shown) of terminals 536 (compare 216) of an interconnection substrate 534 (compare 214). The terminals 536 are concave. In this example, the terminals 536 are formed like plated through holes (compare 416) that have an upper portion in the form of a trapezoidal solid which has relatively wider base portion at an upper (top, as viewed) surface of the interconnection substrate 534 and its relatively shorter base portion within the interconnection substrate 534.

This is comparable in some regard to the aforementioned technique (see FIG. 4) of "plugging" the end portions of the spring contact elements 110 into plated through holes, but relies entirely on vertical pressure to effect the desired contact between the DUT 102 and the terminals 516, 526, 536 of the interconnection substrates 514, 524, 534, respectively. In each of the examples of FIGS. 5A, 5B and 5C, the tip 110a of the spring contact structure 110 enters the concave terminal 516, 526, 536 at its widest portion, thus "capturing" the ends 110a of the spring contact elements 110 with the terminals.

In this manner, there is provided a socketing technique making connections with end portions of elongate contact structures extending from a semiconductor device by:

providing a plurality of concave terminals on an interconnection substrate, each of the concave terminals having a widest portion at a surface of the interconnection substrate; and pressing the tips of the elongate contact structures into the concave terminals.

A Horizontal Pressure Technique

There have been described hereinabove a number of techniques for effecting temporary pressure connections to elongate spring contact elements (110) of a springed semiconductor device (102) by applying pressure vertically (normal to the surface of the component 102) to the tips (110a)

of the spring contact elements (110). In certain instances, this can cause the spring contact elements (110) to become permanently (plastically) deformed in the z-axis. It is thus desirable to provide a technique for making a "z-less" or low insertion force socket for contacting the elongate spring contact elements (110) of springed semiconductor devices (102). Hence, there are described hereinbelow a number of techniques for making temporary pressure connections to elongate spring contact elements (110) of a springed semiconductor device (102) by applying pressure horizontally (parallel to the surface of component 102) to end portions of the spring contact elements (110).

Figure 6A:
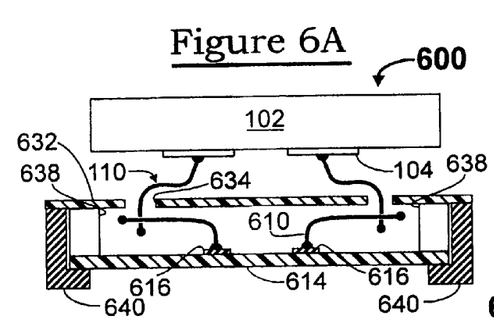
FIG. 6A is a side cross-sectional view of another technique of horizontally contacting spring contact elements extending from a springed semiconductor device with resilient contact structures extending from terminals of an interconnection substrate, according to the invention.
Figure 6B:
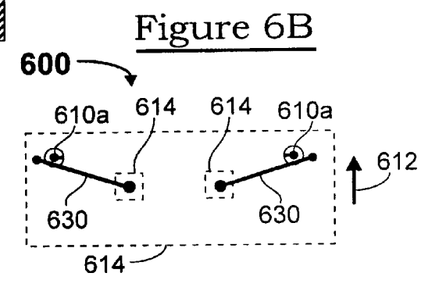
FIG. 6B is a bottom plan view of the apparatus of FIG. 6A, according to the invention.

FIGS. 6A and 6B illustrate a technique 600 for making temporary pressure connections to elongate spring contact elements 110 of a springed semiconductor device (DUT) 102. The tips 110a of the elongate spring contact elements 110 extend through a plurality (two of many shown) of holes 634 (compare 334) through a rigid substrate 632 which is comparable to the aforementioned rigid substrate 332 in that the rigid substrate 632 formes a protective cover for elongate rigid contact structures 610 (compare 310) mounted to and extending from terminals 616 (compare 316) on an interconnection substrate 614 (compare 314). The interconnection substrate 614 is supported below the rigid substrate 632 by a spacer 638 (compare 338) such as a square ring. Also, a body portion 640 of the socket has sidewalls which extends from the lower (bottom, as viewed) surface of the rigid substrate, around the periphery of the interconnection substrate 614, to the bottom surface of the interconnection substrate 614 just within its periphery. The interconnection substrate 614 may be provided with resilient contact structures (not shown) on its bottom (as viewed) surface to make pressure connections to yet another interconnection substrate (not shown) such as a printed circuit board (PCB).

In contrast to the resilient contact structures 310 which are primarily oriented normal to the surface of the interconnection substrate 314 to make vertical pressure connections to the ends 110a of the spring contact elements 110, in this technique the resilient contact structures 610 mounted to and extending from the terminals 616 of the interconnection substrate 614 extend primarily parallel to the surface of the interconnection substrate 614 so as to make horizontal pressure connections to end portions of the spring contact elements 110. As viewed in FIG. 6A, an end portion of each resilient contact structure 630 is positioned to extend horizontally across an end portion of a corresponding one of the spring contact elements 110. Stated another way, the tip 110a of each spring contact element 110 extends beyond the horizontal end portion of a corresponding one of the resilient contact structures 630. As best viewed in FIG. 6B, this ensures that the end portions of the resilient contact structures 630 will resiliently urge against the end portions of the spring contact elements 110 when the interconnection substrate 614 is moved in a direction shown by the arrow 612 (compare 312) which is parallel to the surfaces of the DUT 102 and the interconnection substrate 614. In other words, they "criss-cross" one another.

In this manner, a technique is provided for making connections with end portions of elongate contact structures extending from a semiconductor device by:

urging end portions of elongate resilient contact structures mounted to and extending from terminals on an interconnection substrate horizontally against end portions of spring contact elements mounted to and extending from a semiconductor device.

Another Horizontal Pressure Technique

In the previously-described technique, a single resilient contact structure (610), the end portion of which is horizontally (parallel to the interconnection substrate) oriented, criss-crosses and contacts an end portion of a single spring contact element (110) extending vertically from a semiconductor device (102) with a contact force which is horizontal.

Figure 7A:
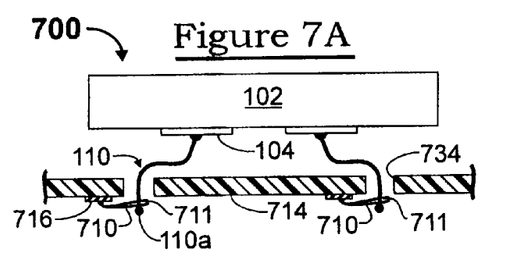
FIG. 7A is a side cross-sectional view of another technique of horizontally contacting spring contact elements extending from a springed semiconductor device with pairs of resilient contact structures extending from terminals of an interconnection substrate, according to the invention.
Figure 7B:
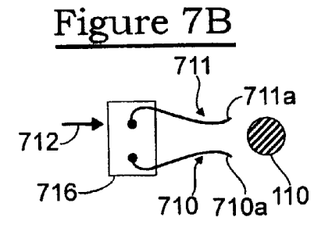
FIG. 7B is a bottom plan view of the apparatus of FIG. 7A, according to the invention.
Figure 7C:
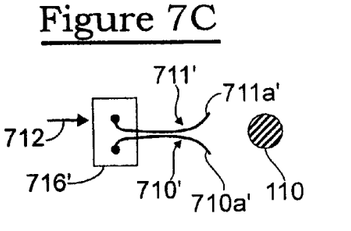
FIG. 7C is a bottom plan view of an alternate embodiment of the apparatus of FIG. 7A, according to the invention.

FIGS. 7A, 7B and 7C illustrate another horizontal pressure technique 700 wherein a pair of (two) generally parallel spaced-apart resilient contact structures 710 and 711 (compare 610) make horizontal contact with an end portion of a spring contact element 110 extending from a springed semiconductor device 102.

As best viewed in FIGS. 7 and 7A, a pair of two spaced-apart resilient contact structures 710 and 711 extend from a single terminal 716 (compare 616) on a bottom (as viewed) surface of an interconnection substrate 714 across a hole 734 (compare 634) through the interconnection substrate 714. An end portion of a corresponding one of the spring contact elements 110 extending from the semiconductor device 102 extends through the hole 734 beyond the resilient contact structures 710 and 711 (i.e., past their z-axis coordinate) at a position which is slightly inward from the ends 710a and 711a of the resilient contact structures 710 and 711, respectively.

In the embodiment of FIG. 7B, the two resilient contact structures 710 and 711 are spaced apart a distance (e.g., 3 mm) which is less than the thickness or diameter (e.g., 5 mm) of the end portion of the spring contact element 110 being captured (pinched) at the position where they will grab the spring contact element 110 and are shaped as follows. They originate from (are mounted to) the same terminal 716 at a distance (e.g. 5 mm) apart from one another, then curve slightly (e.g., 1 mm) outward (away from one another), then curve back towards one another so as to be spaced less than the diameter of the spring contact element 110 from one another, then curve outwards again to provide a "tapered" entry for the spring contact element 110 to slip past their tips 710 and 711 into the gap between the two generally parallel resilient contact structures 710 and 711 when the terminal 716 (i.e., the interconnection substrate 714) is moved in the horizontal direction indicated by the arrow 712 (compare 612).

In the embodiment of FIG. 7C, the two resilient contact structures 710' and 711' are spaced apart a distance (e.g., 3 mm) which is less than the thickness or diameter (e.g., 5 mm) of the end portion of the spring contact element 110 being captured (pinched) at the position where they will grab the spring contact element 110 and are shaped as follows. They originate from (are mounted to) the same terminal 716' at a distance (e.g. 5 mm) apart from one another, then curve slightly (e.g., 1 mm) inward (towards from one another), then curve outwards again to provide a "tapered" entry for the spring contact element 110 to slip past their tips 710' and 711' into the gap between the two generally parallel resilient contact structures 710' and 711' when the terminal 716 (i.e., the interconnection substrate 714) is moved in the horizontal direction indicated by the arrow 712 (compare 612).

In this manner, a technique is provided for making connections with end portions of elongate contact structures extending from a semiconductor device by:

capturing an end portion of a spring contact element mounted to and extending from a semiconductor device between end portions of a pair of horizontally spaced-apart elongate resilient contact structures mounted to and extending from a terminal on an interconnection substrate.

Another Horizontal Pressure Technique

In FIGS. 6A, 6B, 7A, 7B, 7C, techniques are described for effecting a horizontal pressure connection to an elongate spring contact element 110 extending from an electronic component 102 with one or more resilient contact structures (610, 710, 711, 710', 711') extending from terminals (616, 716, 716') of an interconnection substrate (614, 714). This is reminiscent of the technique described with respect to FIG. 3 wherein a vertical pressure connection is made to an elongate spring contact element 110 extending from an electronic component 102 with a resilient contact structures (310) extending from a terminal (316) of an interconnection substrate (314). Both techniques will effect a "soft" pressure connection.

Figure 8:
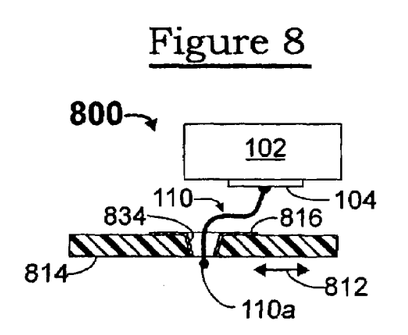
FIG. 8 is a side cross-sectional view of another technique of horizontally contacting spring contact elements extending from a springed semiconductor device with terminals of an interconnection substrate, according to the invention.

FIG. 8 illustrates a technique 800 for effecting a "harder" temporary pressure connection to an end portion of an elongate spring contact element 110 (only one shown in this example) extending from an electronic component 102. In this example, an interconnection substrate 814 (compare 214, 414) is provided with a plurality of through holes 834 (compare 234) which are tapered to have a wider opening to receive the end 110a of a spring contact element 110. The through holes are plated 816 (compare 416) to provide terminals for contacting the end portions of the spring contact elements 110. The through holes need only be partially plated on one side, but are shown as being fully plated.

To effect a pressure connection between the terminals 816 and the end portion of the spring contact element 110, the tip 110a of the spring contact element 110 is inserted from one (top, as viewed) side (surface) of the interconnection substrate 110, through the through hole 834 in the interconnection substrate 814, so that its tip 110a extends out the other (opposite) side of the interconnection substrate 814. Then, the interconnection substrate 814 is moved horizontally, typically in any direction which is parallel to the surface of the electronic component 802, as indicated by the arrow 812 (compare 412) so that the narrower wedge-like portion of the terminal 816 presses into an end portion of the spring contact element 110 near the tip 110a thereof. This wedge-like contact concentrates force over a small contact area, thereby ensuring that sufficient contact force is achieved to effect at least a reliable transient pressure connection between the terminals 816 of the interconnection substrate 814 and the spring contact elements 110 of the springed semiconductor device 102.

In this manner, a technique is provided for making connections with end portions of elongate spring contact elements extending from a semiconductor device by:

providing an interconnection substrate with terminals which are plated through holes which are preferably tapered;

inserting ends of spring contact elements of a springed semiconductor device through the through holes so that end portions of the spring contact elements are within the through holes; and moving the interconnection substrate horizontally to effect a pressure connection to the end portions of the spring contact elements.

Another Horizontal Pressure Technique

Figure 9A:
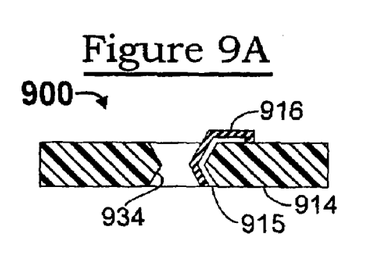
FIGS. 9A and 9B are side cross-sectional views of another technique of horizontally contacting spring contact elements extending from a springed semiconductor device with terminals of an interconnection substrate, according to the invention.
Figure 9B:
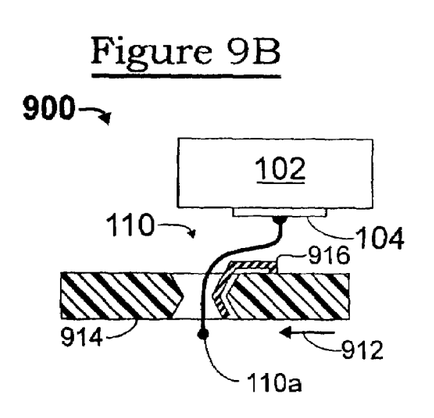

FIG. 8 illustrated a technique 800 for effecting a relatively "hard" wedge-like horizontal pressure connection to an end portion of an elongate spring contact element 110 extending from an electronic component 102. Previously-described techniques, for example that of FIG. 3, illustrate a technique 300 for making relatively "soft" vertical connections to the ends of spring contact elements of springed semiconductor devices. FIGS. 9A and 9B illustrate a technique 900 for making a relatively "soft" horizontal pressure connection to the ends of spring contact elements of springed semiconductor devices.

FIG. 9A illustrates a first step of the technique 900 wherein tapered through holes (one of a plurality shown) 934 (compare 834) are provided through an interconnection substrate 914 (compare 814). In this example, the through holes are hourglass shaped, having relatively larger area openings on the two opposite surfaces (top and bottom, as viewed) of the interconnection substrate 914 and a smaller cross-secctional area at a midpoint (thicknesswise) of the interconnection substrate 914. This is a double-tapered through hole which comes to a point within the body of the interconnection substrate 914.

A patterned layer 915 of sacrificial metal material such as aluminum is applied to a one (right, as viewed) side of each through hole 934, such as by plating. The interconnection substrate 914 can be a copper clad PCB to facilitate such plating, and a patterned layer can be plated by first masking the copper.

A layer 916 (compare 816) of another dissimilar metal material such as nickel is applied over the patterned layer 915. This layer 916 will conform to the pattern of the underlying layer 915. Alternatively, the layer 915 is not patterned, and the layer 916 is applied to be patterned (e.g., by first masking the layer 915).

Next, as illustrated in FIG. 9B, the patterned sacrificial layer 915 is removed. This is done using any suitable well-known process such as selective chemical etching, and results in terminals which are double-tapered "fingers" of relatively hard material (916) originating from one side of the interconnection substrate 914 and extending in a cantilever manner within the through holes 934. As illustrated, each of these finger-like terminals (916) comes to a point within the body of the interconnection substrate.

To effect a pressure connection between the terminals 916 and the end portion of the spring contact element 110, the tip 110a of the spring contact element 110 is inserted from one (top, as viewed) side (surface) of the interconnection substrate 110, through the through hole 934 in the interconnection substrate 914, so that its tip 110a extends out the other (opposite) side of the interconnection substrate 914. Then, the interconnection substrate 914 is moved horizontally, typically in any direction which is parallel to the surface of the electronic component 802, as indicated by the arrow 912 (compare 812) so that the point of the finger-like terminal 916 presses into an end portion of the spring contact element 110 near the tip 110a thereof. This wedge-like contact concentrates force over a small contact area, thereby ensuring that sufficient contact force is achieved to effect at least a reliable transient pressure connection between the terminals 916 of the interconnection substrate 914 and the spring contact elements 110 of the springed semiconductor device 102. The material and thickness of the material 916 is selected to be somewhat yielding when the interconnection substrate 914 is urged horizontally against the spring contact elements 110 extending through the through holes.

In this manner, a technique is provided for making connections with end portions of elongate spring contact elements extending from a semiconductor device by:

providing an interconnection substrate with terminals which are elongate finger-like terminals extending in a cantilever-like manner into double-tapered through holes;

inserting ends of spring contact elements of a springed semiconductor device through the through holes so that end portions of the spring contact elements are within the through holes; and moving the interconnection substrate horizontally to effect a pressure connection between the terminals and the end portions of the spring contact elements.

Although the invention has been illustrated and described in detail in the drawings and foregoing description, the same is to be considered as illustrative and not restrictive in character it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

The invention claimed is:

1. A method of electrically connecting an electronic device to a substrate, said method comprising:
    passing free ends of a plurality of elongate spring contacts attached to said electronic device into a plurality of rigid, conductive recesses in a first surface of said substrate, each said recess comprising a bottom portion disposed within said substrate that prevents said free ends from passing through said substrate, conductive elements providing electrical paths from said recesses to a second surface of said substrate; and
    applying a force to said electronic device and thereby pressing said free ends against said bottom portions of said rigid, conductive recesses, wherein electrical connections between said elongate spring contacts and said rigid, conductive recesses are established and maintained substantially entirely due to said pressing, wherein for each said conductive recess, each portion of said conductive recess is electrically connected to every other portion of said conductive recess.

2. The method of claim 1, wherein said electronic device comprises a semiconductor device.

3. The method of claim 2, wherein said semiconductor device comprises a semiconductor die comprising an integrated electronic circuit.

4. The method of claim 1, wherein each of said recesses is V shaped.

5. The method of claim 1, wherein each of said recesses is U shaped.

6. The method of claim 1, wherein each of said recesses is trapezoidal shaped.

7. The method of claim 1, wherein each of said recesses is wider near a surface of said substrate than within said substrate.

8. The method of claim 1, wherein each of said recesses extends into said substrate and is tapered inwardly.

9. The method of claim 1 further comprising removing said force, wherein said electrical connections are substantially eliminated.

10. The method of claim 1, wherein each said recess comprises a cavity in said substrate, wherein said cavity comprises said bottom portion of each said recess.

11. The method of claim 1, wherein each said recess comprises:
    a cavity in said substrate, and
    a metallic plating disposed on a surface of said cavity, wherein said bottom portion of each said recess comprises said plating.

12. The method of claim 1, wherein said substrate comprises a second electronic device to which said electronic device is electrically connected by said electrical connections between said elongate spring contact and said recesses.

13. The method of claim 1, wherein said bottom portion of said recess comprises a plated portion of said substrate.

14. The method of claim 1, wherein:
    said elongate spring contacts are electrically conductive;
    said recesses are electrically conductive; and
    said bottoms of said recesses are electrically conductive.

15. The method of claim 1, wherein each said recess comprises side walls extending from a surface of said substrate to said bottom portion, wherein said side walls are electrically conductive and electrically connected to said bottom portion.

16. The method of claim 1, wherein each of said conductive elements extends from one of said bottom portions of said recesses to said second surface, and said second surface is opposite said first surface.

17. A method of electrically connecting an electronic device to a substrate, said method comprising:
    providing an electronic device having a plurality of elongate, spring contact elements for providing signal inputs to and/or outputs from said electronic device; and
    pressing tips of ones of said spring contact elements against rigid conductive terminals disposed adjacent a first surface of said substrate, conductive elements providing electrical paths from said terminals to a second surface of said substrate, said pressing compressing said spring contact elements and generating in said spring contact elements spring reaction forces that are perpendicular with respect to said first surface of said substrate, wherein electrical connections between said elongate spring contacts and said rigid terminals are established and maintained substantially entirely due to said pressing, wherein each said terminal comprises a recess that comprises electrically conductive side walls and an electrically conductive bottom portion, said side walls extending from a surface of said substrate to said bottom portion, wherein said side walls are electrically connected to said bottom portion.

18. The method of claim 17, wherein said electrical connections are substantially eliminated by ceasing said pressing step.

19. The method claim 17, wherein said electronic device comprises a semiconductor device.

20. The method of claim 19, wherein said semiconductor device comprises a semiconductor die comprising an integrated electronic circuit.

21. The method of claim 17, wherein:
    said spring contacts are electrically conductive; and
    said terminals are electrically conductive.

22. The method of claim 17, wherein:
    said step of pressing comprises passing said tips through said recesses.

23. The method of claim 22, wherein said pressing comprises pressing said tips against said bottom portions of said recesses.

24. The method of claim 23, wherein each of said conductive elements extends from one of said bottoms of said recesses to said second surface, and said second surface is opposite said first surface.

25. The method of claim 1, wherein the passing step comprises passing each one of said free ends of said spring contacts into a different one of said recesses.

26. The method of claim 23, wherein said bottom prevents said tips from passing through said substrate.

27. The method of claim 26, wherein said recesses are cone shaped.

28. The method of claim 26, wherein said recesses are concave.

29. The method of claim 26, wherein each of said recesses is V shaped.

30. The method of claim 26, wherein each of said recesses is U shaped.

31. The method of claim 26, wherein each of said recesses is trapezoidal shaped.

32. The method of claim 26, wherein each of said recesses is wider near a surface of said substrate than within said substrate.

33. The method of claim 26, wherein each of said recesses extends into said substrate and is tapered inwardly.

34. The method of claim 26, wherein each said recess comprises a cavity in said substrate, wherein said cavity comprises said bottom portion of each said recess.

35. The method of claim 26, wherein each said recess comprises:
    a cavity in said substrate, and
    a metallic plating disposed on a surface of said cavity,
    wherein said bottom portion of each said recess comprises said plating.

36. The method of claim 26, wherein said substrate comprises a second electronic device to which said electronic device is electrically connected by said electrical connections between said elongate spring contact and said terminals.

37. The method of claim 26, wherein said bottom portion of said recess comprises a plated portion of said substrate.

38. The method of claim 26, wherein:
    said elongate spring contact elements are electrically conductive;
    said recesses are electrically conductive; and
    said bottoms of said recesses are electrically conductive.

* * * * *